Oct. 27, 1970 W. MEER ET AL 3,535,771

METHOD OF PRODUCING A TRANSISTOR

Filed May 19, 1967

1

3,535,771
METHOD OF PRODUCING A TRANSISTOR
Winfried Meer, Hohenbrunn, and Wolfgang Schembs, Munich, Germany, assignors to Siemens Aktiengesellschaft, a corporation of Germany
Filed May 19, 1967, Ser. No. 639,885
Claims priority, application Germany, May 23, 1966, S 103,928
Int. Cl. H01l 7/10
U.S. Cl. 29—578 7 Claims

ABSTRACT OF THE DISCLOSURE

A method of producing a transistor whose base region is produced by diffusion or epitaxy upon a semiconductor crystal serving as a collector, and having an alloyed-in emitter region, is described. In the method the base-region surface, lying opposite to the p-n junction between the base and collector regions, is provided with a metal layer having an activator which produces the conductance type of the emitter. This metal layer is partially coated with a layer of etching-resistant material and its exposed portions are completely removed by etching. Thereafter activator material from the remaining metal layer is so alloyed or diffused into the base region, accompanied by the formation of an emitter region, that the geometry of the resulting emitter region is essentially defined by the geometry of the remaining metal layer.

Figure 1:
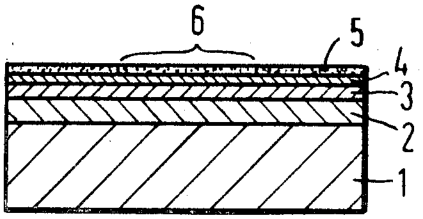

German Pat. 1,170,555 describes a method of producing semiconductor components, such as a transistor with three regions of opposite conductance type, wherein two adjacent indiffused regions are very thin in comparison with the third region. The areas of said regions increase stepwise in the direction of the thick region, and the free surface portions of the two regions are, respectively, provided with an ohmic contact electrode. The method is characterized by the fact that a portion of the surface of the first region, especially the middle, is provided with a solder spot, and that the semiconductor region around the solder spot is protected with a cover layer against etching agents. The etching is then continued until the uncoated portion of the first region is removed and the second region becomes exposed. Subsequently, the protective layer is extended over a portion of the second region adequate for contacting purposes. The non-protected portion of the second region, as well as a portion of the third region, are etched away in such a manner that the first and second regions form an elevation. Finally, the protective layer is removed and the second and third regions are contacted.

A similar method is described in the German Auslegeschrift No. 1,208,007.

By contrast to these known methods, our invention aims to produce transistors, especially for high-frequency purposes, with a defined structure of the emitter region. To this end, vapor-depositing masks would have to be used to execute the known methods, which would provide a defined structure for the generally extremely small-area emitter electrodes. These vapor-deposition masks must be sufficiently heat resistant and therefore are comprised of a heat-resistant metal. Contrary to photovarnish masks, these masks cannot be attached with sufficient intensity to the semiconducor surface. This results in impaired exactness of the geometry and of the reproduction. If, on the other hand, photovarnish masks are employed, the aforementioned disadvantages are not found but the electrode material must be applied at very low temperatures. This impairs the adhesiveness and the wettability of the semiconductor surface by the electrode material during alloying.

2

To eliminate these disadvantages, our method of producing a transistor with a base region, obtained by diffusion or epitaxy, on a semiconductor crystal serving as a collector and an alloyed-in emitter region, provides that the surface of the base region lying opposite the p-n junction between the base and collector regions is provided with a metal layer having an activator which produces the conductance type of the emitter. This metal layer is partly covered with a layer of etching-resistant material and the exposed portions of said metal layer are again completely removed by means of etching. Finally, activator material from the remaining metal layer is so indiffused or alloyed into the base region, under development of an emitter region, that the geometry of the emitter region essentially corresponds to the geometry of the remaining metal layer. Thus, we provide a method with a full-area vapor deposition of emitter material upon the base region, produced by diffusion and/or epitaxy, at elevated temperatures and of etching the emitter material from the final structure, for example by means of photovarnish masking. After removing the photovarnish masking, which serves for etching the structure of the emitter, a second photovarnish masking, serving to produce a base electrode, is so applied to the entire semiconductor surface that the remnants of the emitter layer are, thus, being covered. Subsequently, the material of the base region is applied. Finally, the second mask is removed and the emitter and base connection is alloyed in.

U.S. patent application Ser. No. 615,210 discloses a method of coating two closely adjacent discrete regions of a semiconductor surface with doping and/or electrode material, which is characterized by the fact that the semiconductor surface, at least in the first of these regions, is coated with the material intended for coating said region. The material in the first region is completely coated with an etch-resistant layer (leaving no openings). The surface of the other region to be coated is left free by this layer. The surface of the other of the regions to be coated is subjected to an etching treatment to remove possibly present material, which had been deposited during the first operational step, and/or for removing semiconductor material, and finally, without a prior removal of the etch-resistant layer from the surface of the first region, the coating of the second region is applied onto the semiconductor surface. The method described therein may be used to advantage for producing two closely adjacent electrodes, such as an emitter and a base electrode of a transistor, to be produced in accordance with the present invention. In this connection we also point to U.S. patent application Ser. No. 611,010 which also leads, in a preferred way, to closely adjacent electrodes.

The following example describes the method according to the present invention as used for producing a diffused germanium p-n-p transistor. The following steps are used:

(1) Polished monocrystalline germanium discs of p-type, for example, having a specific resistance of several milliohm-cm. and a surface which is inclined from the 111-plane by an angle of approximately 0.5–1.5°, are used as the starting material. An epitactic layer with a specific resistance of, for example, 0.3 ohm-cm. is applied to the inclined surface.

(2) A germanium layer of between 1 and 10$\mu$ thickness and having a resistance of, for example, 0.3 ohm-cm. which, when a p-conducting substrate is employed, is also p-conducting, is the carrier of the actual function.

(3) An n-conducting base region is indiffused into the above region, for example by using antimony or arsenic as an activator material. The indiffusion may be effected over the total area or limited by masking. The depth of penetration of the base region is, preferably, established at 0.5–1.5$\mu$ and the area expansion resistance at 40–100 ohm. The semiconductor surface is then heated for a few minutes, for example 10 minutes, under vacuum. The appropriate processing temperature for germanium is 500–700° C.

(4) Next is the vapor deposition of emitter material under high vacuum and at elevated temperature, i.e. above dissociating temperature of the photovarnish masking and below the eutectic temperature (for example at 350° C.). A layer thickness of 1000–3000 A. is adjusted thereby. The material used to produce this layer is aluminum or an aluminum-gold alloy, containing two parts aluminum to one part gold.

(5) The vapor-deposited layer of emitter material is now covered with a layer of photovarnish. The latter is illuminated in accordance with a desired geometry and subsequently developed. The surface of the base region, lying beneath, is exposed as a result of the developing process, which removes those portions of the photovarnish which, for example, were not illuminated. The aforementioned base region is treated with an etching solution until the material of the emitter layer is again removed at the exposed locations, up to the semiconductor surface.

(6) Following the structure etching of the emitter geometry, a new mask, for example a photovarnish or metal, is applied for the purpose of vapor-depositing the base connection. The semiconductor surface left free by the mask is now vaporized with a material for producing the base electrode, for example a mixture of gold-antimony, followed by silver-antimony for example at a layer thickness of 500–2000 A.

(7) After the mask and the material, absorbed by it from the base electrode, are removed, the applied emitter and base materials are alloyed under hydrogen, for example. For the described example, an alloying period of 10 minutes and an alloying temperature of about 500° C. are needed.

If necessary, purifying processes may be utilized between the individual steps 1–7. The alloying process of the emitter and base connection, respectively, may also be effected at separate times.

Figure 2:
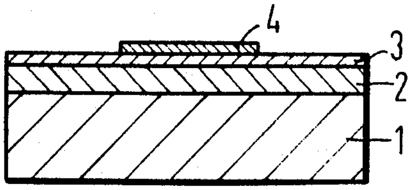
Figure 3:
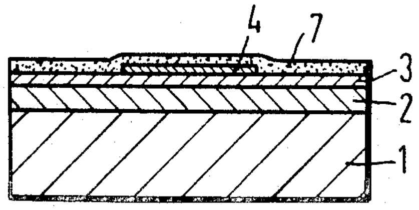

The drawing shows schematically in FIGS. 1–5 an example of a particular embodiment. The disc-shaped semiconductor crystal 1, comprised of silicon or germanium of one conductance type, is provided at its surface with an epitactic layer 2 of the same semiconductor material of the same conductance type. This epitactic layer 2 is provided in the known manner and by diffusion from a surface region 3, of opposite conductance type, which constitutes the base region of the transistor. The base region is covered with the metal layer 4, which is used in the production of the emitter and the emitter electrode. A masking layer 5, comprised of photovarnish, is applied to layer 4 and the masking layer is illuminated in known manner. After the illuminated layer is developed, a portion 6 of the photovarnish layer remains. This portion 6 serves as the etching mask. If the surface of the semiconductor crystals, at both sides of the etching mask, is subjected to an etching agent which, preferably, attacks the material of layer 5 but not the semiconductor material, then a distance is obtained for layer 5 on both sides of the masking layer 6. After the etching mask 6 has been removed, the structure illustrated in FIG. 2 is obtained.

Figure 4:
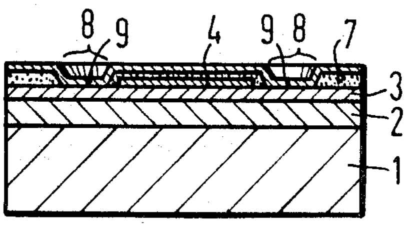
Figure 5:
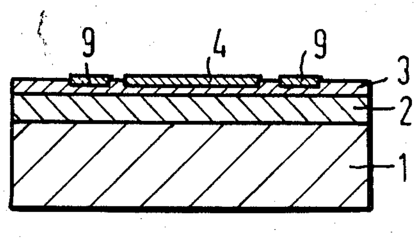

After a renewed application of a layer 7 of photovarnish (see FIG. 3) and renewed illumination as well as development processes, region 8 of the semiconductor surface adjacent to the remaining portion of the emitter coating, is freed at the base region and the metal of base electrode 9 is vapor-deposited thereon (FIG. 4). The alloying process takes place following the removal of the second photovarnish mask. The result is the emitter-pn junction as well as an ohmic contact of the base region (FIG. 5).

German Pat. No. 1,170,555 corresponds to U.S. Pats. No. 2,945,286 and No. 2,978,617.

We claim:

1. A method of producing a transistor having a base region produced by diffusion or epitaxy from gaseous phase upon a semiconductor crystal as a collector and an alloyed-in emitter region, which comprises providing the base-region surface, lying opposite to the p-n junction between the base and collector regions, with a metal layer having an activator which produces the conductance type of the emitter; partially coating said metal layer with a layer of etch-resistant material, removing the exposed portions by etching and thereafter alloying an activator material from the remaining metal layer into the base region, to form an emitter region, with the geometry of the resulting emitter region being essentially defined by the geometry of the remaining metal layer and the base electrode being applied and simultaneously indiffused or alloyed with the material producing the emitter region.

2. The method of claim 1, wherein in order to produce two closely adjacent emitter and base electrodes, the semiconductor surface in the region of the emitter electrode is coated with the material specified for its production, this material is then coated in the region of the emitter electrode to be produced, with a layer of etching-resistant material, while the surface of the region selected to receive the base electrode is left free by said layer, the surface of the region to be covered by the base electrode is then subjected to an etching step to remove possible material, which was deposited during the application of the emitter electrode, and semiconductor material, and without previously removing the etching-resistant layer covering the emitter electrode, coating a specified location with the base electrode.

3. The method of claim 2, wherein the etching mask which produces the emitter geometry is a photovarnish.

4. The method of claim 3, wherein the metal for producing the emitter region is vapor-deposited at elevated temperatures onto the surface of the base region.

5. The method of claim 4, wherein the material of the base electrode is vapor-deposited at low temperatures, employing a photoresist mask.

6. The method of claim 5, wherein the vapor deposition of the emitter material takes place at an elevated temperature of the semiconductor surface.

7. The method of claim 6, wherein the surface of the semiconductor is heated, under vacuum, prior to the application of the emitter material.

References Cited

UNITED STATES PATENTS

| | | | |
|---|---|---|---|
| 2,856,320 | 10/1958 | Swanson | 29—576 |
| 2,967,793 | 6/1961 | Philips. | |
| 3,028,655 | 4/1962 | Dacey et al. | |
| 3,108,359 | 10/1963 | Moore et al. | |
| 3,319,138 | 5/1967 | Bergman et al. | |
| 3,341,375 | 9/1967 | Hochberg et al. | 148—175 |

PAUL M. COHEN, Primary Examiner

R. B. LAZARUS, Assistant Examiner

U.S. Cl. X.R

29—571, 576; 317—234